(12) United States Patent
Aoki

(10) Patent No.: US 7,141,121 B2
(45) Date of Patent: Nov. 28, 2006

(54) SEMICONDUCTOR WASHING SOLUTION AND METHOD OF PRODUCING SEMICONDUCTOR DEVICE USING THE SAME

(75) Inventor: Hidemitsu Aoki, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/440,762

(22) Filed: May 19, 2003

(65) Prior Publication Data

US 2003/0205241 A1 Nov. 6, 2003

Related U.S. Application Data

(63) Continuation of application No. 09/047,057, filed on Mar. 24, 1998, now abandoned.

(30) Foreign Application Priority Data

Apr. 3, 1997 (JP) ................................ 9-84809

(51) Int. Cl.
*B08B 3/08* (2006.01)
*B08B 3/12* (2006.01)

(52) U.S. Cl. .................. 134/2; 134/1.3; 252/193
(58) Field of Classification Search .................. 134/1, 134/1.3, 2, 3; 252/79.5, 186.43, 193
See application file for complete search history.

(56) References Cited

FOREIGN PATENT DOCUMENTS

JP            61 60799     *   3/1986

* cited by examiner

*Primary Examiner*—Alexander Markoff
(74) *Attorney, Agent, or Firm*—Michael Best & Friedrich LLP

(57) ABSTRACT

The invention provides a semiconductor washing solution which can suppress occurrence of variation of the shape of a semiconductor device when the semiconductor device is washed and can maintain a stabilized washing capacity for a long period of time. An organic acid ammonium salt is added to a mixed solution of ammonium hydroxide, hydrogen peroxide and water ($NH_4OH:H_2O_2:H_2O$) to prepare the semiconductor washing solution. The organic acid ammonium salt to be added is one or more selected from ammonium acetate, ammonium citrate, ammonium formate and ammonium oxalate. The concentration of the added organic acid ammonium salt ranges from 0.1 mol/l to 20 mol/l.

9 Claims, 5 Drawing Sheets

SEMICONDUCTOR WASHING SOLUTION AND METHOD OF PRODUCING SEMICONDUCTOR DEVICE USING THE SAME

This application is a continuation of U.S. patent application Ser. No. 09/047,057 filed Mar. 24, 1998 now abandoned, which claims priority of Japanese Patent Application No. 9-84809 filed Apr. 3, 1997.

BACKGROUND OF THE INVENTION

1. Field of the Invention

This invention relates to a semiconductor washing solution and a method of producing a semiconductor device using the semiconductor washing solution, and more particularly to a semiconductor washing solution which is used to remove various fine particles sticking to a semiconductor substrate in a process of production of a semiconductor device and a method of producing a semiconductor device using the semiconductor washing solution.

2. Description of the Related Art

While a semiconductor device is formed by repeating various steps of film formation, photo-lithography, etching, oxidation, heat treatment and so forth, a semiconductor substrate is subject to various contaminations in the production steps. Therefore, between each adjacent steps, washing for removing contaminations is performed. However, as a tendency of increase in scale and refinement of semiconductor devices is exhibited in recent years, the influence of contamination upon a device characteristic has been and is increasing. Thus, it progressively becomes important to remove foreign articles or contaminations to the utmost from semiconductor devices.

Among various contaminations, the contamination of fine particles occurs in the steps of transportation, film formation, dry etching and so forth. Since the contamination of fine particles has a significant influence upon the yield of semiconductor device, it is desired to remove the contamination of fine particles completely. However, it is difficult to remove fine particles sticking to fine recessed portions such as, for example, contact holes by rinsing with water or washing with a gas-phase washing agent. Therefore, it is a common practice to perform washing, after a step of film formation or dry etching in which particle contamination is liable to occur, using a mixed solution of ammonium hydroxide, hydrogen peroxide and water ($NH_4OH:H_2O_2:H_2O$) (the solution is hereinafter referred to as APM) which has a high fine particle removing capacity.

For example, referring to FIGS. 5(a) and 5(b), a doped oxide film (PSG, BPSG or the like) 2, a non-doped oxide film (NSG) 3, another doped oxide film 4 and another non-doped oxide film 5 are deposited as an inter-layer insulating film on a silicon substrate 1, and a contact hole 6 for exposing the surface of the substrate 1 therethrough is perforated as seen FIG. 5(a) using a photo-lithography method and a dry etching method and then APM washing is performed (refer to FIG. 5(b)). Thereafter, a metal film for filling up the contact hole 6 is deposited, for example, by a CVD method.

For the APM used for the washing operation of the type mentioned, an APM whose composition ratio is $NH_4OH:H_2O_2:H_2O=x:y:20$ ($x=0.01$ to 5 and $y=0.1$ to 4) or the like is used normally, and is used in a temperature range from 60° C. to 80° C. The processing time of the substrate is approximately 4 minutes to 20 minutes.

Since the conventional APM described above exhibits a higher etching rate for a doped oxide film than for a non-doped oxide film, if washing is performed using the processing solution for a contact hole provided in an inter-layer insulating film formed from a non-doped oxide film and a doped oxide film layered on each other, unevenness or offsets are formed on an inner wall of a contact hole as seen in FIG. 5(b). If such unevenness appears, then it is impossible to fill up the hole completely with a plug material, and this gives rise to production of a void.

Further, since the conventional APM exhibits a high etching rate, disconnection of a wiring line is caused by reduction of the film thickness of the wiring line or occurrence of incomplete contact is sometimes invited by the loss of a conductive film at a bottom portion of a contact hole.

In this manner, a harmful influence that unevenness or offsets are produced or reduction of a film thickness is caused by APM washing is described in a journal of a society, *Study of Aerosol*, 1996, Vol. 11(1), No. 8–15, pp.8–13, particularly in connection with FIG. 8.

Further, since the conventional APM is used at a temperature higher than 60° C., ammonia which has a comparatively high vapor pressure vaporizes comparatively quickly. Such vaporization of ammonia varies the composition of the APM and drops the washing capacity of the APM. In order to compensate for such vaporization of the APM to eliminate the drop of the washing capacity, an ammonia solution must be supplemented frequently (after each several minutes) to keep the composition ratio fixed.

SUMMARY OF THE INVENTION

It is an object of the present invention to provide a semiconductor washing solution which can suppress occurrence of variation of the shape of a semiconductor device when the semiconductor device is washed and a method of producing a semiconductor device using the semiconductor washing solution.

It is another object of the present invention to provide a semiconductor washing solution which can maintain a stabilized washing capacity for a long period of time and a method of producing a semiconductor device using the semiconductor washing solution.

In order to attain the objects described above, according to an aspect of the present invention, there is provided a semiconductor washing solution, consisting of an organic acid ammonium salt added to a mixed solution of ammonium hydroxide, hydrogen peroxide and water.

The organic acid ammonium salt is one or more selected from ammonium acetate, ammonium citrate, ammonium formate and ammonium oxalate.

Preferably, the concentration of the added organic acid ammonium salt ranges from 0.1 mol/l to 20 mol/l.

Preferably, the composition ratio of the mixed solution of ammonium hydroxide, hydrogen peroxide and water to which the organic acid ammonium salt is added is $NH_4OH:H_2O_2:H_2O=x:y:20$ where $x=0.01$ to 5 and $y=0.1$ to 4.

According to another aspect of the present invention, there is provided a method of producing a semiconductor device, comprising the step of washing, after any step in which a semiconductor substrate may be subject to contamination by fine particles in film formation, dry etching or the like, the semiconductor substrate with a washing solution consisting of organic acid ammonium salt added to a mixed solution of ammonium hydroxide, hydrogen peroxide and water.

In order to achieve a higher washing effect, preferably the washing is performed while the temperature of the washing solution is kept lower than 80° C. but higher than 30° C. or while ultrasonic vibrations are applied to the semiconductor substrate.

Since the semiconductor washing solution consists of an organic acid ammonium salt to an APM, the following advantages can be anticipated. First, the etching rate difference between a doped oxide film and a non-doped oxide film of an inter-layer insulating film of a semiconductor substrate which is washed with the semiconductor washing solution can be moderated, and production of unevenness or offsets which are caused by the washing processing particularly at a location where the two oxide films are located adjacent each other can be suppressed. Further, etching of a conductive film such as a silicide film can be suppressed, and occurrence of disconnection or incomplete contact which arises from reduction in thickness can be suppressed. Furthermore, the semiconductor washing solution can be used stably for a long time.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

According to the present invention, a semiconductor washing solution consists of an organic acid ammonium salt added to a mixed solution (APM) of ammonium hydroxide, hydrogen peroxide and water, that is, $NH_4OH$, $H_2O_2$ and $H_2O$.

As the organic acid ammonium salt to be added to the APM, ammonium acetate, ammonium citrate, ammonium formate and ammonium oxalate are available, and at least one of them is added. The organic acid ammonium salt is added such that the concentration thereof comes within a range from 0.1 mol/l to 20 mol/l. Further, the composition of the APM to which the organic acid ammonium salt is added is $NH_4OH:H_2O_2:H_2O=x:y:20$ where $x=0.01$ to 5 and $y=0.1$ to 4.

Figure 1:
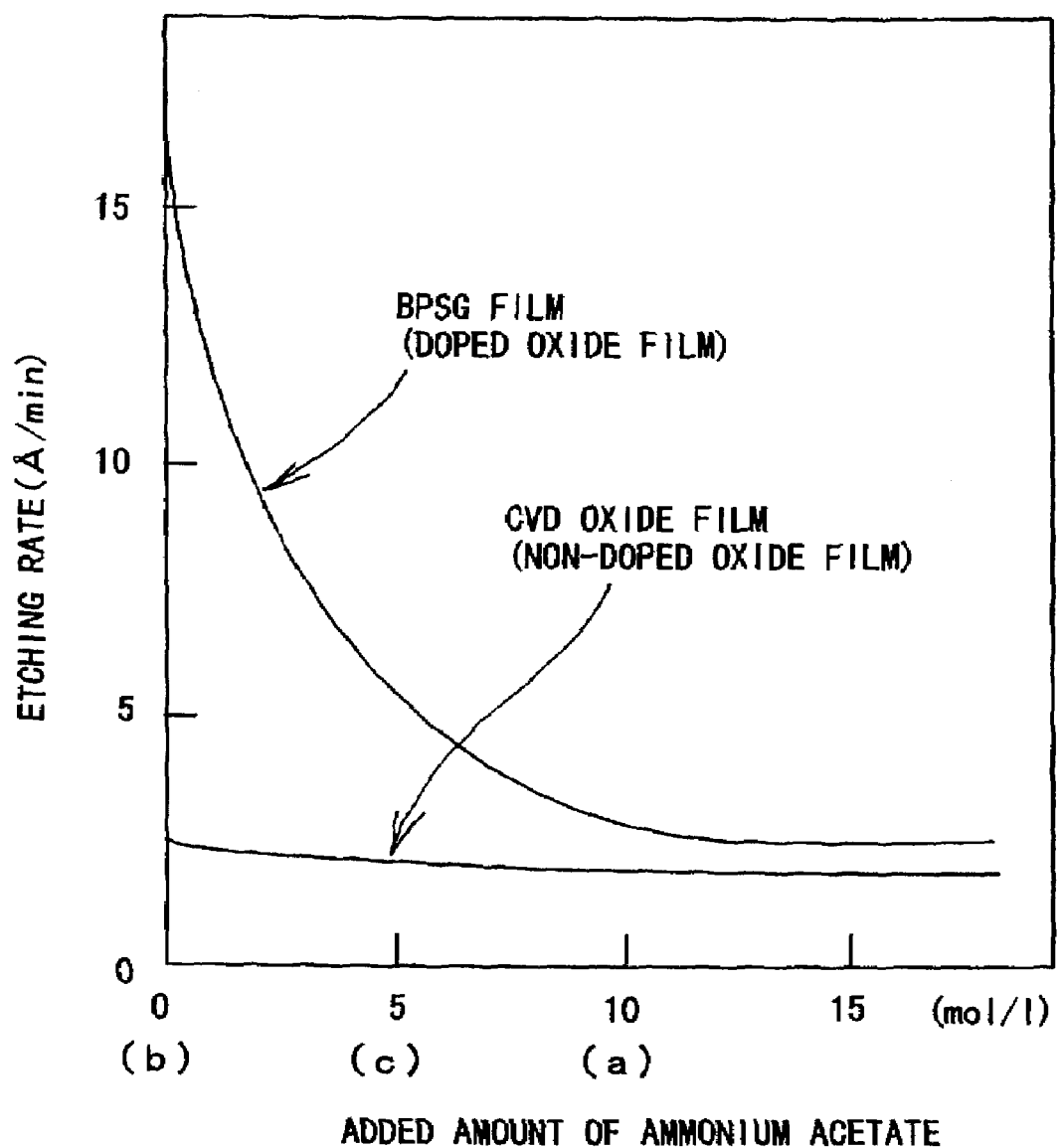
FIG. 1 is a graph illustrating etching rates of a BPSG or doped oxide film and a CVD oxide or non-doped oxide film with respect to the added amount of ammonium acetate to an APM solution according to the present invention.

Further, where the washing solution according to the present invention is used, washing is performed while ultrasonic vibrations are applied in accordance with the necessity.

Where an organic acid ammonium salt is added to an APM, since the organic acid ammonium salt acts as a buffer upon the APM solution, the etching rate difference between a doped oxide film and a non-doped oxide film is moderated, and unevenness in fine configuration by washing processing can be suppressed. FIG. 1 illustrate the etching rates of a BPSG film and a non-doped CVD oxide film where an APM ($NH_4OH:H_2O_2:H_2O=1:4:20$) to which ammonium acetate is added is used. It can be seen from FIG. 1 that, as the added amount increases, the etching rate difference between the two films is suppressed, and where ammonium acetate is added by more than 10 mol/l, the BPSG film and the non-doped oxide film exhibit a substantially equal etching rate.

Figure 2A:
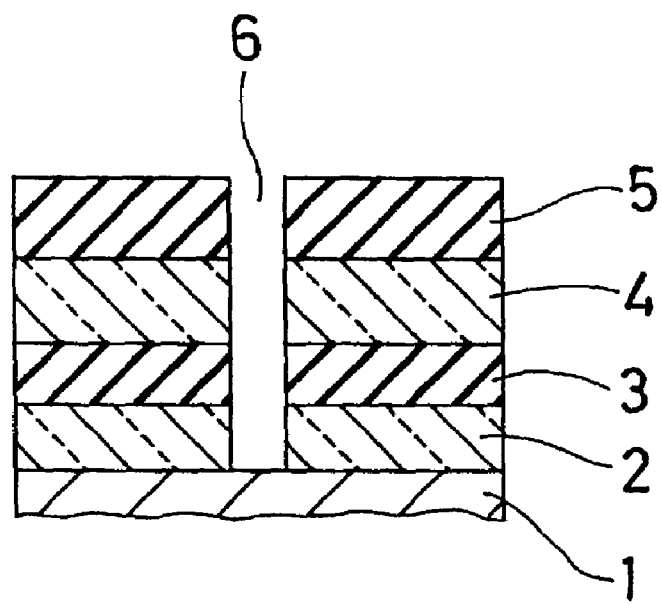
FIGS. 2(a) and 2(b) are sectional views illustrating conditions of a fine contact hole before and after washing processing is performed using an APM to which an organic acid ammonium salt is added, respectively.
Figure 2B:
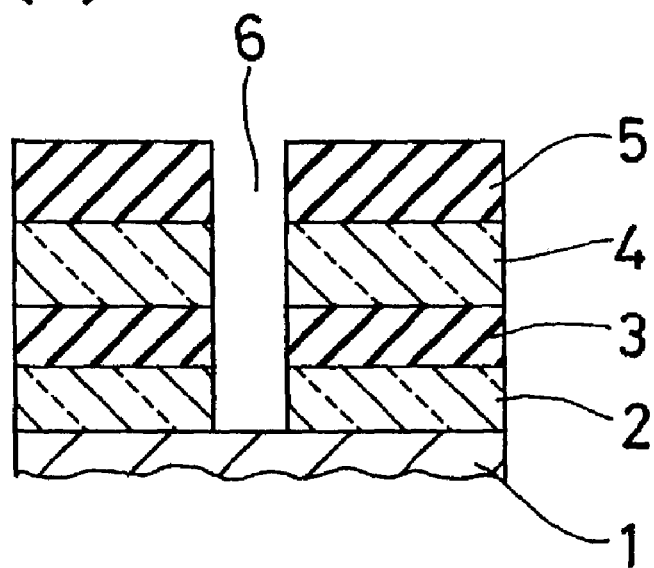
Figure 5A:
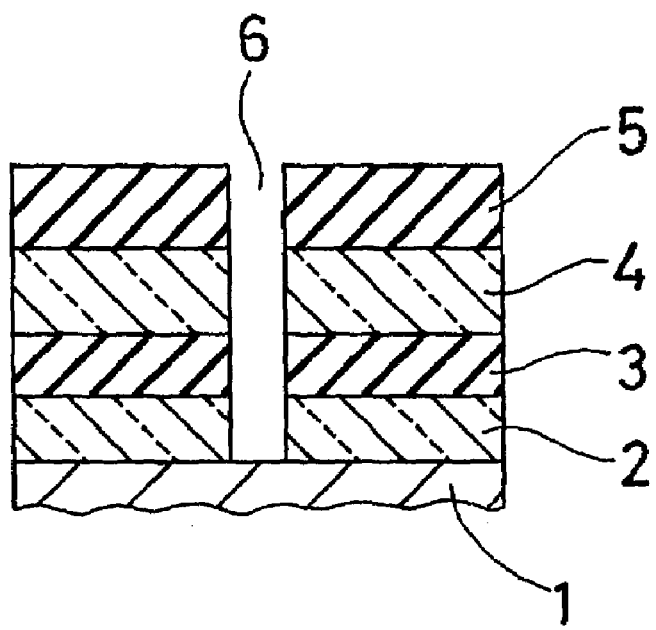
FIGS. 5(a) and 5(b) are sectional views showing conditions of a fine contact hole before and after washing where a conventional APM is used, respectively.
Figure 5B:
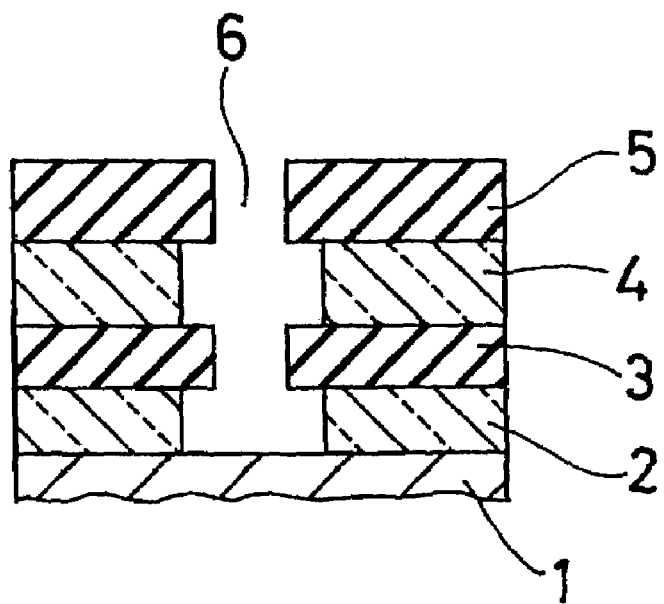

FIG. 2(a) shows in sectional view a semiconductor substrate which has an inter-layer insulating film formed therein and has a contact hole 6 perforated therein in a similar manner as in the conventional semiconductor substrate described hereinabove with reference to FIG. 5(a), and FIG. 2(b) shows in sectional view the semiconductor substrate after washing processing is performed therefor with the washing solution according to the present invention. In particular, with the washing solution of the present invention, since the difference in etching rate between a doped oxide film and a non-doped oxide film is moderated, after the washing processing is performed, no unevenness is observed on an inner wall of the contact hole as seen in FIG. 2(b).

Further, with the washing solution of the present invention, since the etching rate is moderated, reduction in thickness of a conductor layer is reduced, and consequently, occurrence of disconnection of a conductor or incomplete contact between conductors can be suppressed. Then, where washing is performed while the solution is kept at a low temperature of 30 to 60° C., the etching rate can be further suppressed. In this instance, if mechanical vibrations such as ultrasonic vibrations are applied, then the washing effect can be further improved while suppressing the etching rate low. However, since the washing capacity drops at a temperature lower than 30° C., the washing solution is preferably used at a temperature higher than 30° C.

Also where an organic acid ammonium salt other than ammonium acetate was used as the organic acid ammonium salt to be added to the APM, substantially similar results to that illustrated in FIG. 1 were obtained.

Where the original concentration of $NH_4OH$ in the APM to which the organic acid ammonium salt is added is low, even if the added amount of the organic acid ammonium salt is small, the difference in etching rate between a doped oxide film and a non-doped oxide film can be reduced. According to an experiment conducted by the inventor of the present invention, with an APM ($NH_4OH:H_2O_2:H_2O=0.01:y:20$) of the lowest ammonium concentration with which a washing capacity is observed, by setting the added amount of the organic acid ammonium salt to approximately 0.1 mol/l or more, the difference in etching rate between doped and non-doped oxide films was successfully reduced to a degree at which there is no problem in practical use. Further, while, in the present invention, the added amount of organic acid ammonium salt is set smaller than 20 mol/l, an added amount larger than this value substantially causes saturation and consequently does not make sense.

Further, with the washing solution by the present invention, if the ammonia in the APM vaporizes and the chemical balance in concentration of ammonia is lost, then ammonium ions dissociate from the added organic acid ammonium salt, and consequently, the concentration of ammonium in the APM is kept stably.

Figure 3:
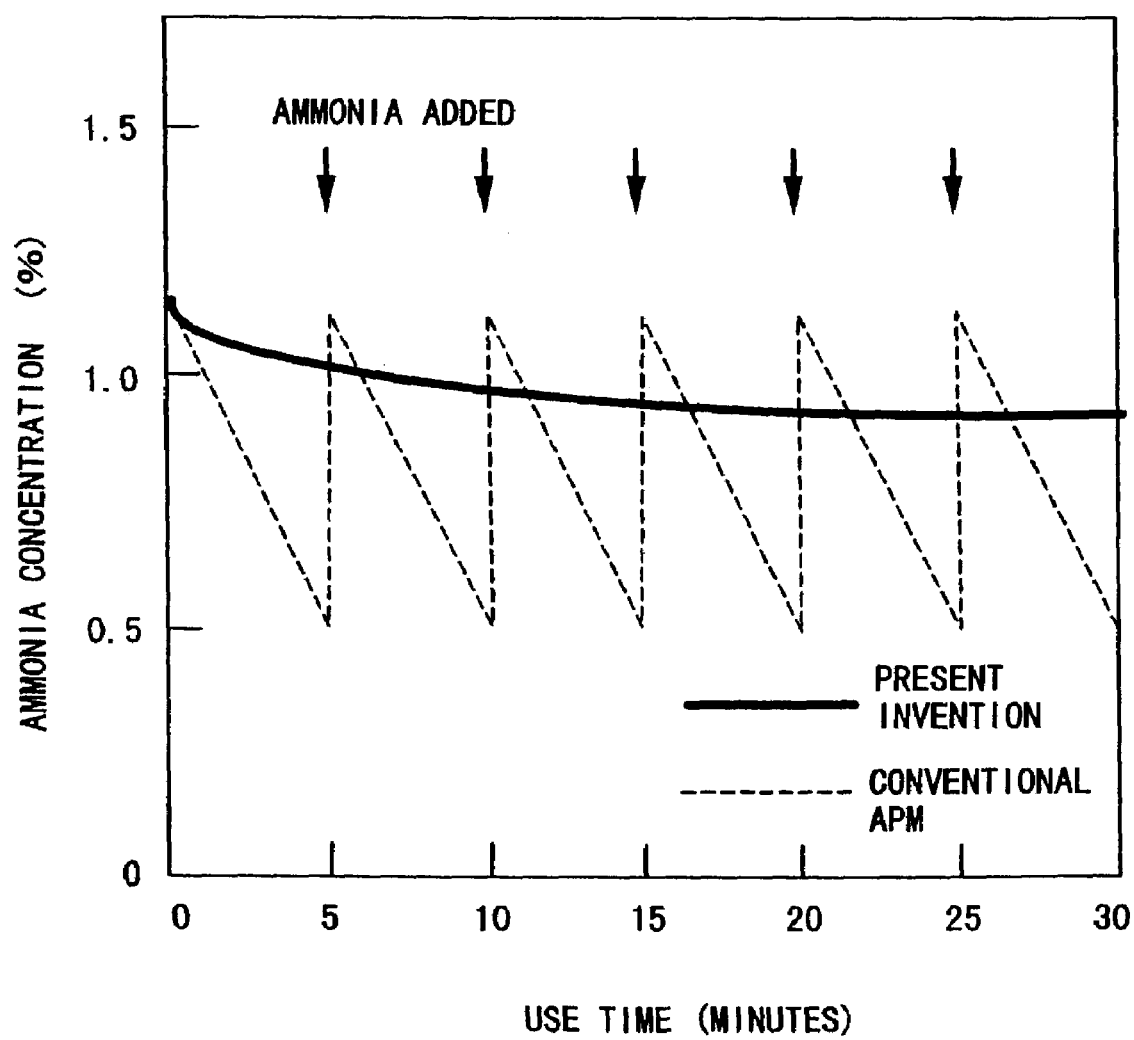
FIG. 3 is a graph illustrating a use time dependency of the ammonium ion concentration in a solution of a washing solution and an APM according to the present invention.

In FIG. 3, a transition with respect to time of the concentration of ammonia in a washing solution consisting of ammonium acetate added to a concentration of 10 mol/l to an APM ($NH_4OH:H_2O_2:H_2O=1:4:20$) is indicated by a solid line. Further, for contrast with it, a concentration of ammonia in a case wherein a conventional APM is used while ammonia is supplemented cyclically is indicated by a dotted line. While, with the conventional APM, the concentration of ammonia drops in approximately 5 minutes and ammonia must be added after each 5 minutes, with the solution of the present invention, since the concentration ammonia exhibits a transition stable for up to approximately 30 minutes, it can be seen that there is no need of supplementing ammonia frequently.

EXAMPLE 1

Figure 4A:
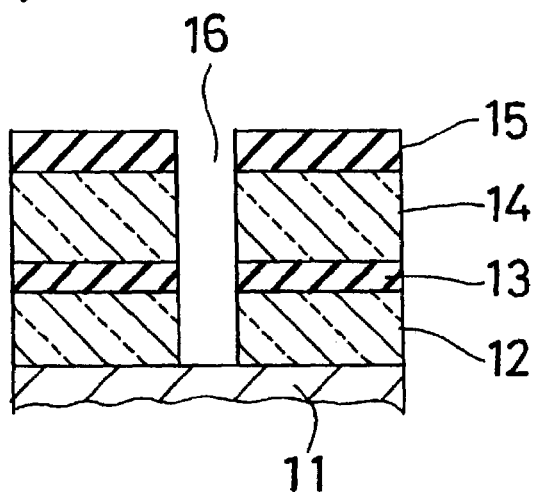
FIGS. 4(a) to 4(c) are sectional views reproduced from sectional shape SEM photographs after the inside of a hole is processed with different solutions according to examples of the present invention, Comparative Example 1 and Comparative Example 2.

Ammonium acetate was added to a concentration of 10 mol/l to an APM ($NH_4OH:H_2O_2:H_2O=1:4:20$) to prepare a washing solution. As shown in FIG. 4(A), a BPSG film 12 0.3 µm thick, an NSG film 13 0.1 µm thick, another BPSG film 14 0.4 µm thick and another NSG film 15 0.2 µm thick were deposited as an inter-layer insulating layer on a silicon substrate 11 by a CVD method to produce a semiconductor substrate, and a hole 16 of a diameter of 0.25 µm was perforated in the inter-layer insulating film. The semiconductor substrate was washed for 7 minutes using the washing solution prepared in such a manner as described above while the washing solution was kept at 65° C. A sectional view reproduced from an SEM photograph after the washing is shown in FIG. 4(A). The difference in etching amount between the BPSG films and the NSG films in the hole 16 was approximately 5 angstrom.

COMPARATIVE EXAMPLE 1

Figure 4B:
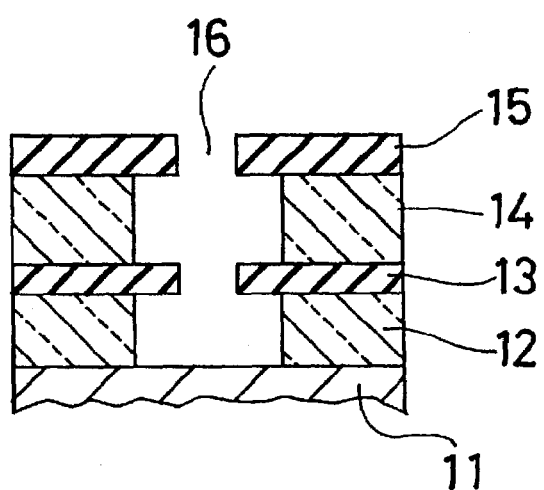

The semiconductor substrate used in Example 1 was washed in the same conditions as those in Example 1 using an APM ($NH_4OH:H_2O_2:H_2O=1:4:20$) to which no ammonium acetate was added. A sectional view of the semiconductor substrate after the washing is shown in FIG. 4(b). Since the BPSG films were etched by approximately 150 angstrom while the NSG films were etched only by 25 angstrom, significant unevenness was formed in the hole 16.

COMPARATIVE EXAMPLE 2

Figure 4C:
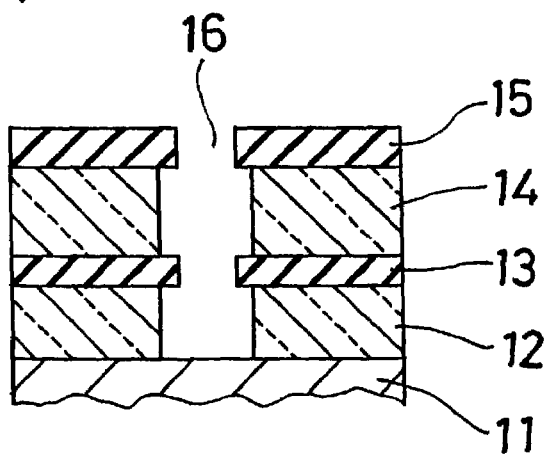

The semiconductor substrate used in Example 1 was washed in the same conditions as those in Example 1 using an APM ($NH_4OH:H_2O_2:H_2O=1:4:20$) to which ammonium acetate was added to a concentration of 5 mol/l. A sectional view of the semiconductor substrate after the washing is shown in FIG. 4(c). Since the BPSG films were etched approximately by 70 angstrom while the NSG films were etched approximately by 20 angstrom, significant unevenness was formed in the hole 16 although such unevenness was smaller than that in Comparative Example 1.

EXAMPLE 2

Ammonium citrate was added to a concentration of 10 mol/l to an APM ($NH_4OH:H_2O_2:H_2O=1:3:20$) to prepare a washing solution. A semiconductor substrate wherein a hole was formed in an inter-layer insulating film shown in FIG. 4(a) was washed in similar conditions to those in Example 1. The difference in etching amount between the BPSG films and the NSG films in the hole 16 after the washing was approximately 5 angstrom.

EXAMPLE 3

Ammonium acetate was added to a concentration of 1 mol/l to an APM ($NH_4OH:H_2O_2:H_2O=0.05:2:20$) to prepare a washing solution. A semiconductor substrate wherein a hole was formed in an inter-layer insulating film as shown in FIG. 4(a) was washed for 20 seconds at a solution temperature of 40° C. while ultrasonic vibrations were applied to the semiconductor substrate. The difference in etching amount between the BPSG films and the NSG films in the hole was so small that this could not have been observed. Further, when a WSi wiring line of a film thickness of 2,000 angstrom patterned on a silicon oxide film was washed in the conditions described above, the side etching amount was smaller than 5 angstrom.

COMPARATIVE EXAMPLE 3

Using an APM ($NH_4OH:H_2O_2:H_2O=0.05:2:20$) to which no organic acid ammonium salt was added, a semiconductor substrate having a WSi wiring line of a film thickness of 2,000 angstrom patterned on a silicon oxide film was washed at a solution temperature of 65° C. for 20 minutes. Side etching of approximately 200 angstrom was observed.

Having now fully described the invention, it will be apparent to one of ordinary skill in the art that many changes and modifications can be made thereto without departing from the spirit and scope of the invention as set forth herein.

What is claimed is:

1. A semiconductor washing solution, including an organic acid ammonium salt having a concentration of about 5 mol/l to about 20 mol/l, ammonium hydroxide, hydrogen peroxide and water, wherein the composition ratio of ammonium hydroxide, hydrogen peroxide and water is $NH_4OH:H_2O_2:H_2O=y:x:20$, and wherein x=0.01 to 5 and y=0.1 to 4.

2. The semiconductor washing solution as claimed in claim 1, wherein the organic acid ammonium salt is one or more selected from ammonium acetate, ammonium citrate, ammonium formate and ammonium oxalate.

3. The semiconductor washing fluid as claimed in claim 1, wherein the organic acid ammonium salt concentration is about 10 to about 20 mol/l.

4. The semiconductor washing fluid as claimed in claim 2, wherein the organic acid ammonium salt is ammonium acetate or ammonium citrate.

5. A semiconductor washing solution including ammonium acetate having a concentration of about 5 mol/l to about 20 mol/l, ammonium hydroxide, hydrogen peroxide and water, wherein the composition ratio of ammonium hydroxide, hydrogen peroxide and water is $NH_4OH:H_2O_2:H_2O=x:y:20$, and wherein x=0.01 to 5 and y=0.1 to 4.

6. A process for fabricating a semiconductor device, the process comprising:

forming a semiconductor substrate having an insulation layer by depositing a non-doped oxide film and a doped oxide film, said non-doped oxide film and said doped oxide film defining a contact hole that exposes said non-doped oxide film and said doped oxide film;

providing a semiconductor washing liquid that includes an organic ammonium salt having a concentration of about 5 mol/l to about 20 mol/l, ammonium hydroxide, hydrogen peroxide and water, wherein the composition ratio of ammonium hydroxide, hydrogen peroxide and water is $NH_4OH:H_2O_2:H_2O=x:y:20$, and wherein $x=0.01$ to 5 and $y=0.1$ to 4; and washing said non-doped oxide film and said doped oxide film with said washing liquid to etch the exposed portions of said non-doped oxide film and said doped oxide film.

7. The fabrication process as set forth in claim 6, wherein said washing step is performed by maintaining a temperature of said washing liquid within a range of 30° C. to 60° C.

8. The fabrication process as set forth in claim 6, wherein said washing step is performed with an application of an ultrasonic vibration.

9. The fabrication process as set forth in claim 6, wherein the organic acid ammonium salt is one or more selected from ammonium acetate, ammonium citrate, ammonium formate and ammonium oxalate.

\* \* \* \* \*